United States Patent [19]

Haeberlin

[11] 4,003,003
[45] Jan. 11, 1977

[54] MULTICHANNEL DIGITAL SYNTHESIZER AND MODULATOR

[76] Inventor: Allen L. Heaberlin, 5737 Avenida Sanchez, San Diego, Calif. 92124

[22] Filed: Nov. 18, 1975

[21] Appl. No.: 633,147

[52] U.S. Cl. .............................. 332/11 R; 84/1.01; 178/66 R; 325/141; 328/14; 332/17; 332/21; 332/22

[51] Int. Cl.² ......................................... H03K 7/00

[58] Field of Search ......... 332/9 R, 22, 11 R, 11 D, 332/17, 21; 328/14; 325/141–143; 84/1.01; 178/66 R

[56] References Cited

UNITED STATES PATENTS

| 3,497,625 | 2/1970 | Hileman et al. | 332/22 X |
| 3,668,562 | 6/1972 | Fritkin | 332/9 R |
| 3,787,785 | 1/1974 | Bass | 332/9 R |

Primary Examiner—Siegfried H. Grimm
Attorney, Agent, or Firm—R. S. Sciascia; G. J. Rubens; T. M. Phillips

[57] ABSTRACT

Apparatus for generating a coherent multichannel signal. The signal for each channel can be independently phase, frequency and amplitude modulated. The coherent multichannel signal is locked to a reference signal. A frequency generator establishes, at each output sample time, the phase information for each channel. A waveshape section converts the phase information into amplitude information to generate the desired waveforms. A multiplier amplitude modulates the generated waveforms which are converted into an analog voltage and fed to a low pass filter for smoothing the output and eliminating undesired high frequencies.

8 Claims, 5 Drawing Figures

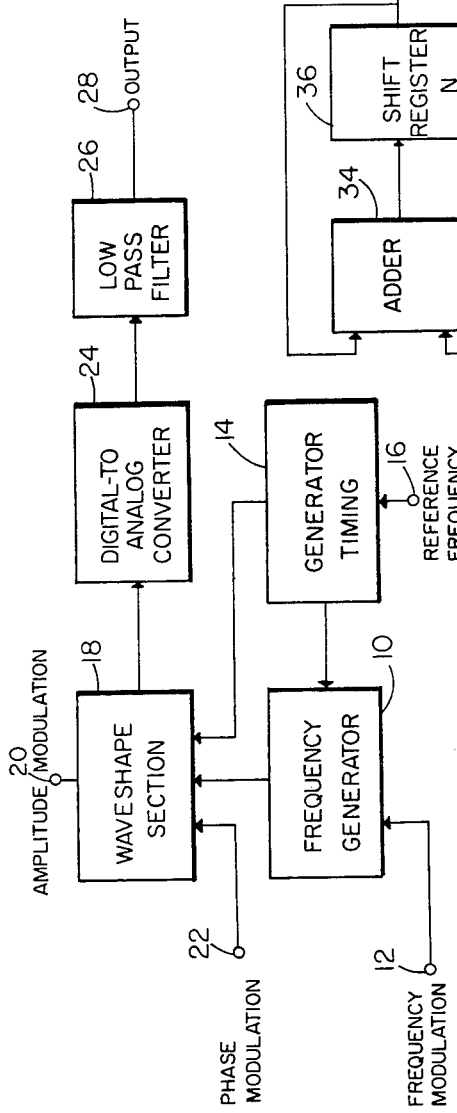
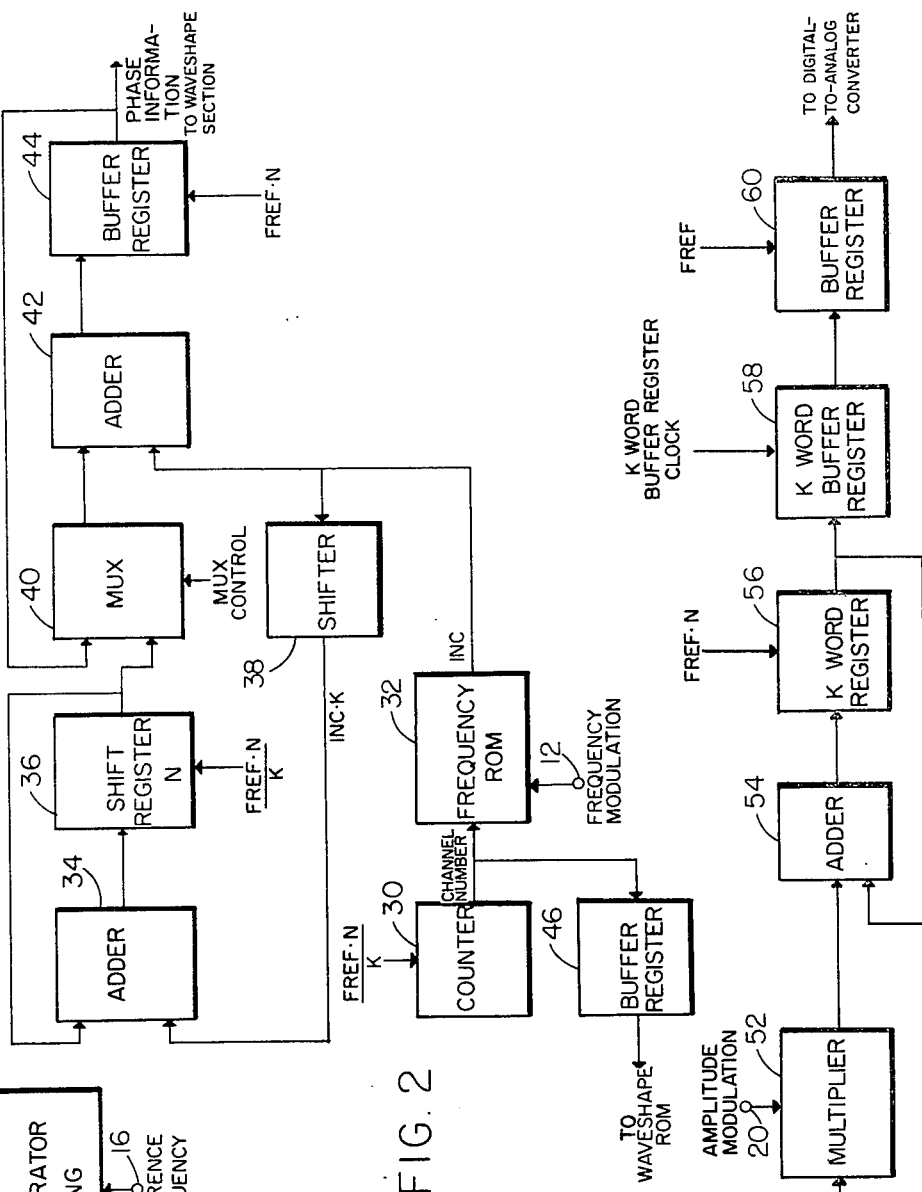
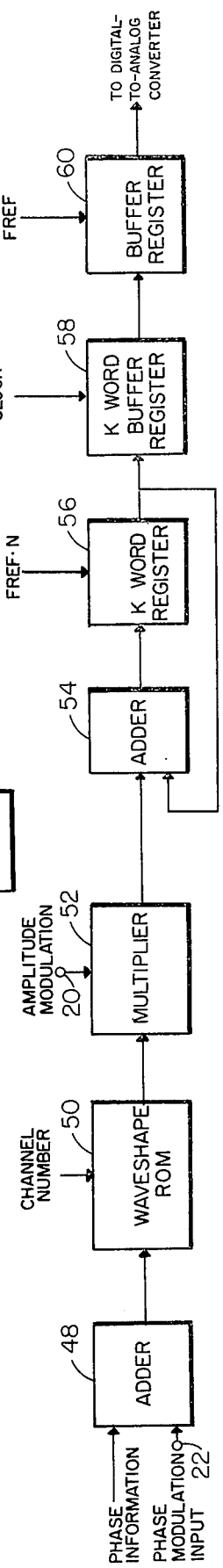
FIG. 1
FIG. 2
FIG. 3

MULTICHANNEL DIGITAL SYNTHESIZER AND MODULATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

In communications it is desirable to have a coherent multichannel signal. A multichannel signal is defined as a signal composed of the sum of channel signals and coherent is defined as the condition where all channel signals are derived from a reference frequency source. This multichannel signal should have the capability for each channel to be independently phase frequency and/or amplitude modulated as well as being coherent and locked to a reference frequency. In present communication systems where multichannels are used, each channel is generated by a single circuit and is burdened with the expense and complexity associated therewith. Also, in organ design it is desirable to have independent tone generation and there are several methods of using digital circuits to generate organ tonal frequencies. The most common approach is to use a plurality of oscillators and divider chains. These circuits have in the most part used a single high frequency oscillator and derived tones by dividing. These circuits have the advantage that they require no tuning and lend themselves to large scale integration and therefore potential cost reduction. However, since the tones are all locked to one oscillator there is no "chorus effect". The chorus effect is when several different oscillators of slightly different frequencies beat together. The chorus effect is desirable because it adds warmth and interest as the beat notes appear to change randomly. Also, if the same note is played on two separate manuals the notes will sound as two separate notes as they should. With the common oscillator approach they will not sound as two distinct notes since both are generated from the same oscillator. This desirable aspect is further verified by the fact that several organ manufacturers use a plurality of independent oscillators as tone generators. The use of multiple oscillators makes it costly to build organs as well as being costly to maintain and tune periodically since an organ constructed in this manner can easily have as many as 200 oscillators.

SUMMARY OF THE INVENTION

The present invention provides for a system for generating coherent multichannel signals which may be used in communication systems as well as in electronic organs or in any other apparatus where a multichannel signal is required. When the present invention is incorporated in the design of electronic organs, all tone generators are locked to a single source thus requiring only one oscillator to be tuned but the tones are pseudoindependent. The listener is "fooled" into believing the tones are generated from separate or independent tone generators, i.e., the tones generated can be of arbitrary frequency and phase and the listener will not realize that they are derived from a single source. A programmed frequency generator controlled from a reference frequency source generates the frequencies, a waveshape section converts the generated frequencies into the desired waveforms. Means are provided for individually modulating each channel of the multichannel signal. An output section converts the digital waveform representations into an analog signal obtaining the multichannel signal.

STATEMENT OF THE OBJECTS OF THE INVENTION

Accordingly, an object of the invention is to provide a means of generating a coherent multichannel signal.

Another object of the invention is the provision of a means of generating a coherent multichannel signal which can be used in communication systems.

Another object of the invention is the provision of a means of generating a signal which can be used as the tonal waveforms for an electronic organ.

Another object of the invention is the provision of a means for generating a coherent multichannel signal wherein each channel may be independently phase, frequency, and/or amplitude modulated.

Other objects, advantages and novel features of the invention will become apparent from the following detailed description of the invention when considered in conjunction with the accompanying drawings.

BRIEF DESCRIPTION OF THE DRAWINGS

Wherein FIG. 1 is a block diagram of the preferred embodiment of the invention.

FIG. 2 is a block diagram of the frequency generator of FIG. 1.

FIG. 3 is a block diagram of the waveshape section of FIG. 1.

DESCRIPTION OF THE PREFERRED EMBODIMENTS

Figure 4:
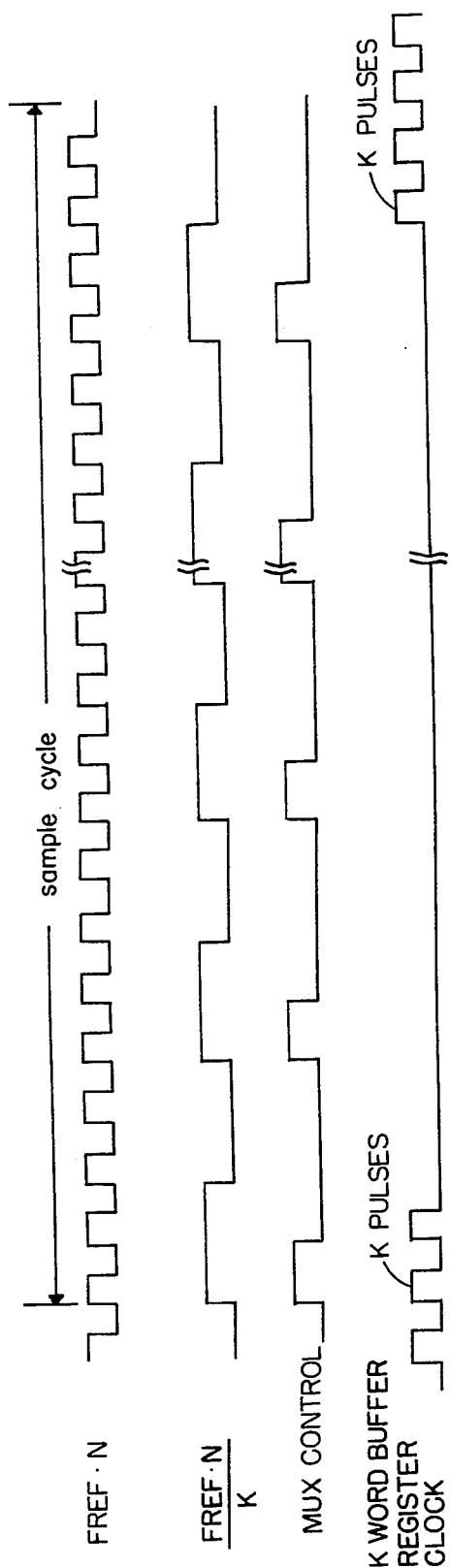
FIGS. 4 and 5 are timing diagrams used in describing the operation of the invention.

Referring now to the drawing wherein there is shown in FIG. 1, a frequency generator 10 for providing phase information for each channel at each output sample point. The output sample point is the point in time where a voltage value is determined for each channel or tone, i.e., each channel or tone will have an independent amplitude. If frequency modulation is desired a digital word corresponding to the desired frequency modulation is applied from a frequency modulation source 12. The proper timing and control functions are provided by a generator timing circuit 14 from a reference frequency source 16. Waveshape section 18 takes the phase information at each sample point for each channel and converts this into a digital word representing the output at each channel and converts this into a digital word representing the output at each sample point. Each channel may be amplitude and/or phase modulated by inputs 20 and 22, respectively. Inputs 12, 20 and 22 may be a digital memory which can be read using the appropriate channel number. This digital memory may be written into from a computer, microprocessor or any other suitable source for providing the amplitude, frequency or phase modulation information. The digital output from waveshape section 18 is fed to digital-to-analog converter 24 where the digital word for each sample point is converted to an analog voltage. To remove the discontinuity between sample values and to limit the bandwidth, the analog signal is fed through a low pass filter 26 to provide the desired waveform at terminal 28. It is to be understood that the output signal at terminal 28 is the sum of the generated channels.

Referring now to FIG. 2 wherein the frequency generator 10 of FIG. 1 is shown in more detail and that by way of example counter 30 has an input signal frequency of ($F_{REF}$ × N)/K for clocking counter 30 to sequence through each channel. As counter 30 sequences through each channel (in the case of electronic organ, the number of channels would be 256, the value of N) a digital word representing the channel number is fed to frequency read-only memory 32. ROM 32 responds to the digital word and the frequency modulation input and provides an output which is the INC (increment) number corresponding to the desired frequency to be generated for that channel.

Inrement is defined as $$INC = F_{OUT}/F_{REF}$$

where $F_{OUT}$ is the desired output frequency for that channel and $R_{REF}$ is the frequency supplied by the reference frequency source. The INC corresponds to the phase shift between sample periods in each channel. As, for example, if $F_{REF}$ is 32 KHz and $F_{OUT}$ is 8 KHz, the INC is 0.25 corresponding to a phase shift of 0.25 × 360° or 90° between each sample point. It should be noted that the output frequency resolution depends on the length of the digital word representing INC. Then all digital words used throughout the system would be of corresponding length.

Frequency read-only memory 32 acts as a look-up table which when given the frequency modulation number and channel number, generates an increment (INC) word which represents the frequency to be generated. Instead of using ROM 32 as a look-up table containing the frequency modulation for each channel, only a single increment for each channel may be stored and an adder following its output may be used to frequency modulate by summing the increment word from ROM 32 and a digital frequency modulation signal.

The phase information necessary for the waveshape section 18 is generated in two sections. The first or slow section consists of an adder 34 and shift register 36. Shift register 36 stores the phase information for each channel. Since N channels are generated, shift register 36 is composed of N words. Adder 34 adds the phase information word fed back from shift register 36 and the INC x K word to generate a new phase information word.

A problem exists if shift register 36 cannot cycle completely during one sample period. In order to permit complete cycling, shift register 36 is clocked at a rate of ($F_{REF}$ ×N)/K. This results in the generating of phase information words corresponding to a sample period of $F_{REF}$/K.

Since the phase information is determined at a frequency K times as slow, the INC to adder 34 will be K times the INC from frequency read-only memory 32. In practice K will be an integer power of 2, such as K = 4. In order to multiply the INC by K the INC word from frequency read-only memory 32 is shifted by means of shifter 38 which may be nothing more than wiring between the frequency read-only memory 32 and adder 34 to provide the desired amount of shift.

The second or fast section consists of multiplexer 40, adder 42 and buffer register 44. As the phase information data word first appears from shift register 36, multiplexer 40 routes this information to one input of adder 42 then uses this phase information and the INC from the frequency read-only memory 32 corresponding to a sample period of $F_{REF}$ to obtain the phased data for a sample period $1/F_{REF}$ later ($T_1$). Then multiplexer 40 routes the output of buffer register 44 to adder 42. The adder 42 uses this new phase information and the INC to obtain phase information for sample period $1/F_{REF}$ later ($T_2 = T_1 + 1/F_{ref}$).

This process continues generating phase data for K sample periods ($T_1, T_2, \ldots T_K$) where each sample period is $1/F_{REF}$ later than the previous sample period. This phase data is for a particular channel and is repeated in the same manner to generate phase data for the other N-1 channels.

Buffer register 46 is used to delay the channel number applied to the waveshape section 18 with sufficient delay to insure that the channel number and channel data are time synchronized when both are applied to waveshape ROM 50.

Referring now to FIG. 3 wherein waveshape section 18 is shown in more detail, phase information and modulation information (amplitude and phase) is used to obtain a digital word corresponding to the output voltage.

Adder 48 uses the phase information and the phase modulation input from any source such as a read-write memory to obtain the phase of the signal. The output signal from adder 48 is the phase information (containing the phase modulation) for each channel generated. Waveshape ROM 50 converts the output signal from adder 48 to amplitude information. The channel number is used to select a different waveform for each channel.

In instances where it is desired to generate sine waves, the channel number is not used and waveshape ROM 50 would contain a sine wave function.

Multiplier 52, amplitude modulates the output waveform from waveshape ROM 50. The source of the amplitude modulating signal could be from any source such as a read-write memory. Adder 54 and K word register 56 add for each of the K sample times amplitude information for all N channels, i.e., channel I, sample 1 is added to channel II, sample 1 etc., up to channel N, sample 1. In like manner the other K-1 samples are obtained.

The output of K word register 56 consists of the amplitude information at each of the K sample points. This information is buffered into K word buffer register 58. Buffer register 60 is clocked by means of $F_{REF}$. By way of example, if $F_{REF}$ is 32 KHz, N = 256 and K = 4 then $F_{REF}$ × N/K = 2.048 MHz.

Figure 5:
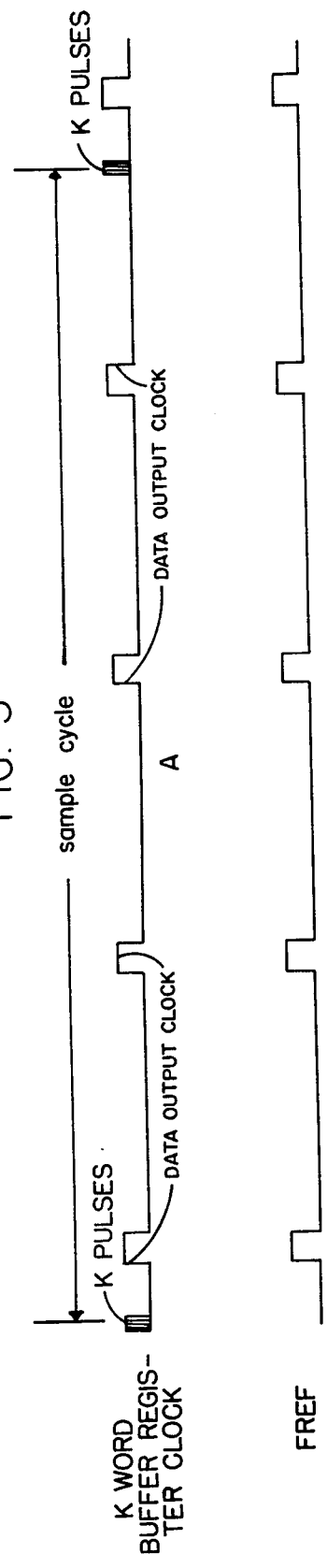

In operation, the various timing signals are generated by generator timing circuit 14 and their relationship is shown in FIGS. 4 and 5. Waveform FREF × N (FIG. 4) is the clock for buffer register 44. Throughout the description it is to be understood that clocking occurs on the positive edge of the clock pulse for counters and registers. FREF × N is the clock for K shift register 36 and counter 30. As can be seen this is the clock pulse for the slow section of the frequency generator.

The MUX control is used to select either the output of shift register 36 or the output of buffer register 44 as an input to adder 42. When the MUX control is high, shift register 36 is selected and when it is low buffer register 44 is selected.

K word buffer clock (FIGS. 4 and 5) provides clocking for the K word buffer register 58. In FIG. 4 is shown the portion (K pulses, K = 4) of the clock which causes the K word buffer register 58 to load data from the K word register 56. Waveform A of FIG. 5 is the same as the K word buffer register clock waveform of FIG. 4 except on a reduced scale. The other portion of the K word buffer register clock (data output clock) is shown in FIG. 5. This is used to clock data out of K word buffer register 58 to buffer register 60. FREF is used to clock the data from the K word buffer register 58 to buffer register 16 and is synchronous with the data output clock described above.

Obviously many modifications and variations of the present invention are possible in the light of the above teachings. It is therefore to be understood that within the scope of the appended claims the invention may be practiced otherwise than as specifically described.

What is claimed is:

1. Apparatus for generating a coherent multichannel signal comprising:
   a. a reference frequency source for providing signals at a predetermined reference frequency;
   b. counter means coupled to said reference frequency source for consecutively sequencing through said reference signals;
   c. increment circuit means having a first input coupled to said counter means and having a second input coupled to a frequency modulation source for generating an increment signal representing the frequency for each of the channel numbers;
   d. phase information circuit means coupled to said increment circuit means for converting each of said increment signals into an output signal representing the phase information at each sampling point for each channel;
   e. waveshape circuit means coupled to said phase information circuit means and being responsive to each of said output signals and its associated phase information for converting said phase information into digital amplitude information signals;
   f. and digital-to-analog converter means coupled to said waveshape circuit means for converting said digital signals into an analog signal that is the sum of said predetermined number of consecutive signals.

2. The apparatus of claim 1 wherein said increment circuit means is a frequency read only memory circuit.

3. The apparatus of claim 1 wherein said phase information circuit means includes:
   a. a first circuit means coupled to said increment circuit means for generating phase information corresponding to an output sample rate that is slower than the frequency of said reference source; and
   b. second circuit means coupled to said increment circuit means and to said first circuit means for generating phase information corresponding to an output sample rate that is the same as the frequency of said reference source.

4. The apparatus of claim 3 wherein said first circuit means includes:
   a. shift circuit means for adjustably shifting the increment output to increase the increment number by a predetermined value, K;
   b. first adder circuit means having a first input coupled to said shift circuit means, a second input and an output;
   c. shift register means having a first input coupled to the output of said first adder means and having a second input coupled to a clocking source of the same frequency as said counter circuit means and having an output, the output being coupled to the second input of said first adder circuit means.

5. The apparatus of claim 4 wherein said second circuit means includes:
   a. a multiplexer circuit means having a first input coupled to the output of said shift register means, a second input and an output;
   b. second adder circuit means having a first input coupled to the output of said increment circuit means, a second input coupled to the output of said multiplexer circuit means and an output,
   c. a first buffer register means having a first input coupled to the output of said second adder circuit means, a second input coupled to a clocking source of a predetermined frequency and an output coupled to the second input of said multiplexer.

6. The apparatus of claim 1 wherein said waveshape circuit means includes:
   a. first circuit means having a phase information input, a phase modulation input, a channel number input and an amplitude modulation input for generating a signal representing the amplitude for each of the output samples for each channel;
   b. second circuit means having a first input coupled to said first circuit means for adding all the sampled values for all channels corresponding to the same sample time and buffers the summed signal to provide a digital output signal.

7. The apparatus of claim 6 wherein said first circuit means includes:
   a. a third adder circuit means having a first input coupled to the output of said phase information circuit means, a phase modulation input and an output;
   b. a waveshape read only memory having an input coupled to the output of said third adder circuit means, a channel number input coupled to the output of said counter means and an output;
   c. a multiplier circuit means having a first input coupled to the output of said memory, a second input adapted to receive amplitude modulation signals and an output.

8. The apparatus of claim 7 wherein said second circuit means includes:
   a. a fourth adder circuit means having a first input coupled to the output of said multiplier circuit means, a second input and an output;
   b. a register having a first input coupled to the output of said fourth adder circuit means, a second input coupled to a clocking source of the same frequency as the clocking source for said phase information circuit means, and an output connected to the second input of said fourth adder;
   c. second buffer register means having a first input coupled to the output of said register means, a second input coupled to a variable clocking source and an output;
   d. a third buffer register having an input coupled to the output of said second buffer register, a second input coupled to a clocking source of the same frequency as said reference frequency and an output.

* * * * *